United States Patent [19]

Dirmeyer et al.

[11] Patent Number: 4,611,185
[45] Date of Patent: Sep. 9, 1986

[54] ELECTRICAL NOISE FILTER

[75] Inventors: Josef Dirmeyer, Bodenwöhr-Neuenschwand; Hans Kinzler; Karlheinz Lahner, both of Regensburg; Hans-Werner Schulz, Wenzenbach, all of Fed. Rep. of Germany

[73] Assignee: Siemens Aktiengesellschaft, Berlin and Munich, Fed. Rep. of Germany

[21] Appl. No.: 594,655

[22] Filed: Mar. 29, 1984

[30] Foreign Application Priority Data

Apr. 26, 1983 [DE]  Fed. Rep. of Germany ....... 3315036

[51] Int. Cl.⁴ .......................... H03H 7/01; H03H 1/00
[52] U.S. Cl. ...................................... 333/167; 333/12; 333/181; 333/185
[58] Field of Search ................................ 333/167–168, 333/181–185, 12, 177–180, 172; 174/50, 51, 52 R, 52 PE, 52 S, 59; 361/331, 332, 380; 339/143 R, 147 R

[56] References Cited

U.S. PATENT DOCUMENTS 3,267,936  8/1966  Scott ..................... 333/167
3,721,747  3/1973  Renskers ............... 333/185 X
4,519,664  5/1985  Tillotson ................ 333/12 X

FOREIGN PATENT DOCUMENTS 117823  12/1943  Australia ................ 333/175

Primary Examiner—Marvin L. Nussbaum
Attorney, Agent, or Firm—John Francis Moran

[57] ABSTRACT

Electrical noise filter with a filter housing, with electrical terminals led out at open face ends, in particular flat plugs, litz wires, plug pins, and with electrical components, in particular inductances and capacitances which, embedded in sealing compound, are installed in the filter housing and connected to the terminals. The filter housing is extended so that the terminal elements facing outwardly are disposed within the filter housing and shielded.

4 Claims, 4 Drawing Figures

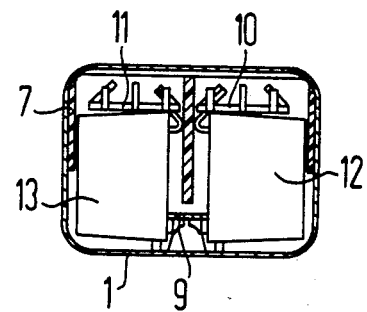
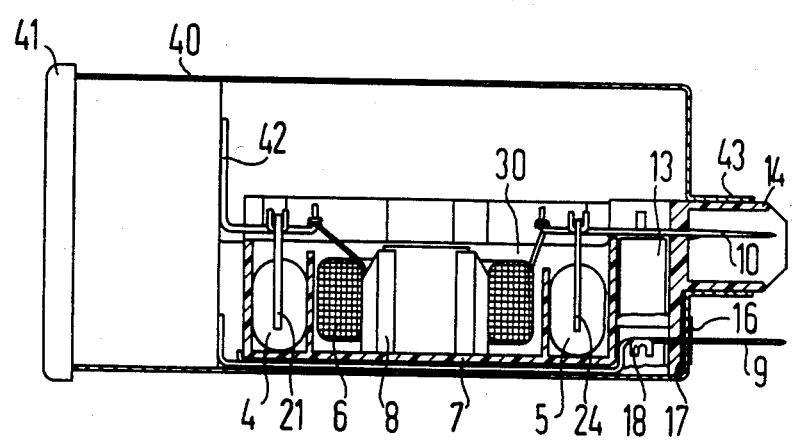

ELECTRICAL NOISE FILTER

BACKGROUND OF THE INVENTION

The invention relates to an electrical noise filter, which consists of a filter housing and associated electrical components. The filter includes, in particular, inductances and capacitances, installed in the housing and embedded in a sealing compound, and with electrical connections, in particular flat plugs, litz wires, pin plugs and the like, which protrude out of the filter housing at open face ends and which are connected to electrical circuit components.

Noise filter of the above mentioned kind are intended for use in desk computers, office machines and medical equipment and the like. Their principal function is the reduction of the line related noise levels. Since these filters, due to their application, are subjected to high electrical and magnetic field strength levels because of the environment in which they operate, it must be ensured that their suppression effectiveness is not reduced through unintended coupling of electrical and magnetic interferences to the wiring or the components of the filter circuit. Especially when used in electrical equipment with combined power supplies and/or microprocessor systems which have long bus runs, these problems are encountered frequently. Tests can be conducted to solve these problems and they involve, for example, the use of metal housings for the noise filters, closed on all sides and with insulated leadthroughs for the terminals. The metal housings can be deep-drawn nickel silver housings or two-piece sheet iron housings soldered tight.

Such filters have become known, for example, as filters with integrated cold appliance plugs in which the connections from the net side are made via this cold appliance plug—usually a so-called power outlet—and the contact to the equipment to be provided with the filter via flat plugs, litz wires, soldering lugs or the like. In this connection, reference is made, for example, to the Technical Report from the Components Area, Ordering No. B/24 18, published by Siemens under the title "Electromagnetic Compatibility Through the Use of Noise Filters", in particular page 18, and to the Siemens brochure "Radio Noise Filter", available under the Ordering No. B/22 84, Supply Program 1980/81, pages 12 and 13.

The terminals and the carriers of the electrical components are tightly cemented into a halfround cup of nickel silver sheet. In this noise filter, the electrical components per se are mounted, insulated and manually soldered into the halfround cup. Subsequently, the electrical components are fixed with a soft epoxy resin compound from the open side of the halfround cup and then mechanically protected by a hard sealing compound.

Other commercially available noise filters employ a deep-drawn nickel silver housing in place of the halfround nickel silver cup. The components are then mounted and soldered in an auxiliary frame with flat plugs. Cementing the components and flat plug parts located in the filter housing is accomplished through a hole in the nickel silver housing which must be tightly sealed to plugs and frame by adding sealing rings. The cementing hole is covered up by a glued-on name plate.

Other noise filters also available commercially utilize a soldered jacket tube of tin plate, the electrical components being mounted to a base plate which is subsequently riveted to the plug. The ground connection is soldered on through a hole in the jacket tube which must be pushed over the plug first. The soldering point is covered up by a name plate. The electrical components are cemented in from the open backside of the jacket tube.

SUMMARY OF THE INVENTION

It is an object of the present invention to provide a noise filter of the kind described above which is characterized by effective magnetic shielding and improved high-frequency properties and which can be produced at the least possible cost to meet national and international specifications for such filters.

This and other objects are achieved by a filter according to the preamble of the patent claims in which the filter housing is extended so that the outwardly facing terminal elements of at least one terminal are disposed so as to be shielded within the filter housing. For this purpose, the filter housing may, for instance, be reduced in section at its open face ends in the manner of a shaft.

Through the extension of the filter housing described above a shielding effect is achieved which is at least comparable with that of a closed filter housing. An extended filter housing is also preferable over a completely closed one from the aspect of cost and production engineering. But if the shielding must meet maximum requirements, the above mentioned use of a tubular filter housing such as of aluminum with only partly closed face ends and shafts integrally attached to the open face edges is recommended. Particularly well suited for this purpose is, for instance, extruded aluminum tubing which can be produced at little cost, which also has good electrical conductivity and which does not impair the magnetic properties of the toroidal core inductor of the filter. The filter housing may also consist of another, electrically well conducting material such as copper or brass, thereby also improving the shielding effect, particularly at low frequencies.

The inside wall of the filter housing, at least in the area of the open face ends, is advantageously insulated electrically; for which purpose there may be inserted into the open face ends of the filter housing a frame of insulating material through which the terminal elements facing outwardly are insulated against the filter housing. This insulating material frame, e.g. a plastic part, containing flues to receive the external terminal elements such as flat plugs, soldering tabs or litz wires, closes off the filter housing faces so that the safety specifications relating to leakage current and flash-over strength are met, in addition to which the external terminal elements are protected by the extended filter housing ends against being touched inadvertently.

The shielding effect can be improved further by bridging the inside walls of the filter housing by a metal web in the area of the terminal elements facing outwardly. This bridging should prove advantageous particulary in those cases where the filter housing is only extended, but not reduced in section, in the manner of a shaft.

The above mentioned plastic inserts and the like may also be integrated in an insulating material housing inserted into the filter housing, the electrical components, especially capacitors and inductors as well as the terminal elements being mounted and, if required, cemented in this insulating material housing. The latter meets in excellent manner the national and international standards relating to air and leakage paths between the electrical components and the filter housing. The insulating material housing has, for instance, separate channels for the terminals, e.g. flat plug terminals and a web, integrally integrated with the insulating material housing, for the separation of the inductor potential. In addition, injection-molded separating walls make possible the installation of capacitors not preassembled, i.e. not mounted in cans, and facilitate the assembly of the electrical components. The insulating material housing, as carrier of the components and terminals, can be preequipped before sliding it into the filter housing. The same applies to the soldering of all connections and the automatic winding of the inductor lead wires around the usually stamped-out wrap pins of the terminals.

Due to the specially designed filter housing and the use of an insulating material housing which can be subdivided by separating walls and the like, sealing the filter once with soft epoxy resin compound is sufficient. This insulating material housing also makes unnecessary an otherwise required sealing of the components against the filter housing and the terminals.

Finally, there may be provided a single grounded conductor, preferably extending over the entire length of the insulating material housing, whose lead is led through the filter housing face wall and connected to the filter housing so as to be electrically conducting. This grounded conductor, which may be riveted to the terminal, for instance, saves assembly time. It may be soldered, for instance, to a piece of sheet copper ultrasonically welded to the filter housing face wall after the filter housing has been pushed over the equipped and demented insulating material housing.

Other features and advantages of the invention will be apparent from the following description of the preferred embodiments, and from the claims.

For a full understanding of the present invention, reference should now be made to the following detailed description of the preferred embodiments of the invention and to the accompanying drawings.

BRIEF DESCRIPTION OF THE DRAWINGS

FIG. 3 is a section along line 3—3 of FIG. 2.

FIG. 4 shows another embodiment of the subject of the invention in the view according to FIG. 2 (identical parts have the same reference symbols).

DETAILED DESCRIPTION

Figure 1:
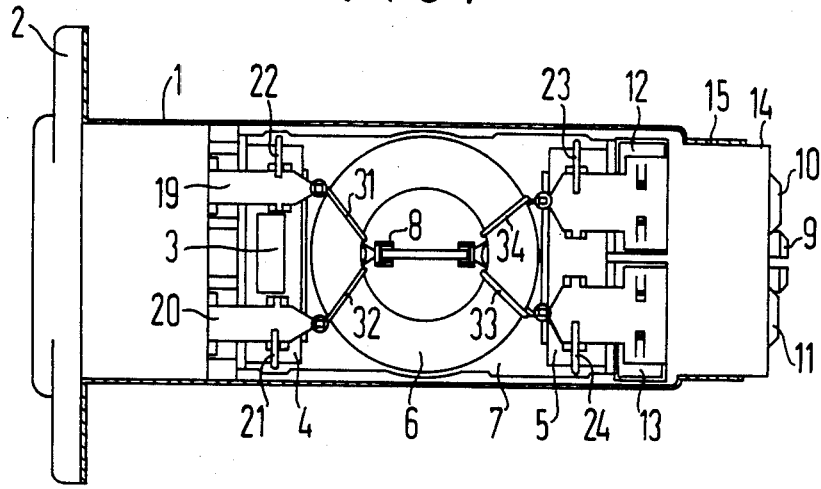
FIG. 1 shows a partially sectioned top view of a noise filter according to the invention.
Figure 2:
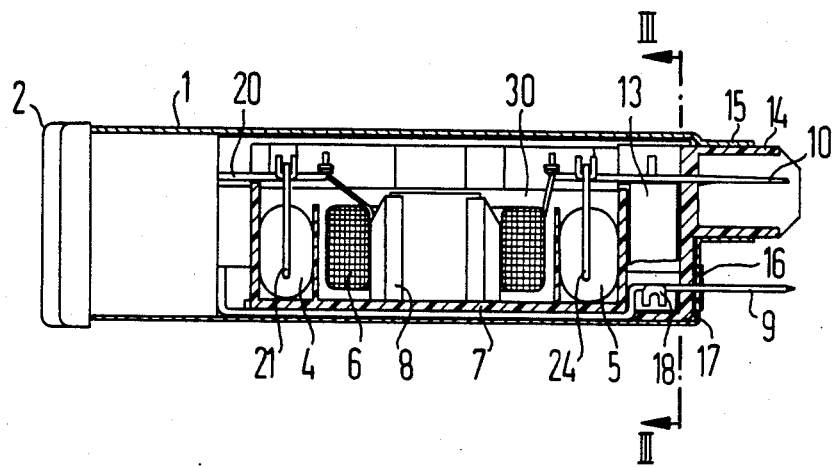
FIG. 2 shows a partially sectioned view of the noise filter according to FIG. 1.

The noise filter according to FIGS. 1 to 3 has a filter housing 1, such as of extruded aluminum tubing, which is reduced in section at its one face 15 in the manner of a shaft and closed by a connector socket 2 at its other face. Inserted into the filter housing 1 is an insulating material housing 7 which may be subdivided, e.g. by separating walls not detailed, into chambers. Mounted in these chambers are electrical components, e.g. an electrical resistor 3, not preassembled electrical capacitors 4, 5 Y-capacitors 12, 13, and a radio noise suppression inductor 6 slid on a potential separating web 8 which is integrally molded to the insulating material housing 7. As shown in FIG. 2, the winding ends 31-34 of the inductor 6 are wound around appropriately bent ends of flat plugs 10, 11, 19 20 are soldered. The same applies to the capacitors 4, 5 and 12, 13 of FIG. 2 which are connected to the appropriate ends of the flat plugs via webs 21, 22, 23 24.

To the face area of the insulating material housing 7 facing the face end 15 is integrally molded a shaft 14 whose outside surfaces rest against the inside surfaces of the filter housing. The electrical components and the flat plugs 10, 11, 19, 20 connected to these components are embedded in epoxy resin 30, only the outwardly facing parts of the flat plugs being left free.

In addition, a grounded conductor 9 is provided, extending over the entire length of the insulating material housing 7. For contact between this ground wire and the filter housing a copper plate is welded ultrasonically to the filter housing 1 in the area where the ground wire penetrates the face wall of filter housing 1. The direct contact between ground wire 9 and this copper plate is established by the solder point indicated at 16.

The Y-capacitors 12, 13 are disposed directly between phase and ground wire housing and contacted to the ground wire at 18. A very low inductance connection is obtained by these extremely short leads.

In FIG. 3, a sectional view as indicated in FIG. 2, the organization of internal components of the filter are illustrated. The short lead connections for the Y-capacitors 12 and 13 is clearly illustrated connecting respectively between flat plugs 11 and 12 and grounded connector 9.

Another illustrative embodiment example of the invention according to FIG. 4 shows a noise filter of essentially the same design. An additional advantage of this filter is that, due to its large size, it can also be used for fused filters. The filter housing 40 is also closed at its face by a connector socket 41 or a broken face wall, at whose break-through a shaft 43 is integrally molded on. Differing from the illustrative embodiment according to FIGS. 1 through 3, the flat plugs 42 facing the connector socket are led out of the insulating material housing 7 at an angle.

There has thus been shown and described a novel electrical line noise filter which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. An electrical interference filter of the type having an external filter housing of highly conductive metal containing an additional insulating material housing filled with a sealing compound of insulating material, the insulating material housing being inserted into the external filter housing and having embedded electrical filter components therein interconnected in circuit relationship to form the filter circuit, the filter comprising:

plug connectors having outer connection elements extending from one end of the insulating material housing serving as ports of the filter circuit, the external filter housing being shaped to include a partially closed face end having an apertured portion of reduced cross section for containing the outer connection elements arranged in the interior of the filter housing;

a ground conductor extending over the entire length of the insulating material housing in the external filter housing having an external connection part extending through a closed area of the face end of the external filter housing and electrically connected with the external filter housing at one location in a conducting manner; and the apertured portion of the external filter housing being extended beyond the face end in the form of a rectangular shaft and encircling the outer connection elements located within this rectangular shaft portion of the external filter housing section and shielded electromagnetically.

2. An electrical interference filter according to claim 1, wherein the inner wall of the external filter housing is electrically insulated in the apertured portion area of its partially closed face end.

3. An electrical interference filter according to claim 1, wherein there is inserted in the shaft-like portion of the external filter housing a shaft-like insulating material section through which the outer connection elements are over their entire length electrically insulated from the external filter housing.

4. An electrical interference filter according to claim 2, wherein there is inserted in the shaft-like portion of the external filter housing a shaft-like insulating material section through which the outer connection elements are over their entire length electrically insulated from the external filter housing.

* * * * *